(12) United States Patent
Takatsu

(10) Patent No.: US 7,828,623 B2
(45) Date of Patent: Nov. 9, 2010

(54) APPARATUS FOR PROCESSING SUBSTRATE AND APPARATUS FOR PROCESSING ELECTRON SOURCE SUBSTRATE

(75) Inventor: Kazumasa Takatsu, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 257 days.

(21) Appl. No.: 11/488,766

(22) Filed: Jul. 19, 2006

(65) Prior Publication Data
US 2007/0034155 A1 Feb. 15, 2007

(30) Foreign Application Priority Data
Aug. 15, 2005 (JP) .............................. 2005-235149

(51) Int. Cl.
*H01J 9/38* (2006.01)
(52) U.S. Cl. .......................................... 445/73; 445/70
(58) Field of Classification Search ................ 250/426, 250/423 R; 445/24, 25, 70, 73; 118/728
See application file for complete search history.

(56) References Cited

U.S. PATENT DOCUMENTS

| 4,167,161 | A | * | 9/1979 | Nakagami | 123/308 |
|---|---|---|---|---|---|
| 5,564,958 | A | * | 10/1996 | Itoh et al. | 445/6 |
| 5,622,634 | A | | 4/1997 | Noma et al. | 216/40 |
| 6,169,356 | B1 | | 1/2001 | Ohnishi et al. | 313/495 |
| 6,384,541 | B1 | | 5/2002 | Ohnishi et al. | 315/169.3 |
| 6,626,718 | B2 | * | 9/2003 | Hiroki | 445/6 |
| 6,872,112 | B2 | * | 3/2005 | Ota | 445/6 |
| 7,226,331 | B2 | | 6/2007 | Kamata et al. | 445/3 |
| 2002/0011205 | A1 | * | 1/2002 | Yamazaki et al. | 118/620 |
| 2002/0022430 | A1 | * | 2/2002 | Kimura et al. | 445/73 |
| 2004/0152388 | A1 | * | 8/2004 | Kimura et al. | 445/24 |
| 2004/0154545 | A1 | * | 8/2004 | Takeda et al. | 118/728 |
| 2005/0009433 | A1 | * | 1/2005 | Nomura et al. | 445/24 |
| 2005/0127812 | A1 | | 6/2005 | Takatsu et al. | 313/495 |

FOREIGN PATENT DOCUMENTS

JP 7-235255 9/1995
JP 8-171849 7/1996

* cited by examiner

*Primary Examiner*—Jack I Berman
*Assistant Examiner*—Brooke Purinton
(74) *Attorney, Agent, or Firm*—Fitzpatrick, Cella, Harper & Scinto

(57) ABSTRACT

In a substrate processing apparatus for processing a substrate in a hermetic container equipped with an exhaust tube and a gas introducing tube, an introducing port of the gas introducing tube is positioned inside the exhaust tube to make uniform an atmosphere in the hermetic container, in the vicinity of an exhaust port of the exhaust tube.

3 Claims, 6 Drawing Sheets

APPARATUS FOR PROCESSING SUBSTRATE AND APPARATUS FOR PROCESSING ELECTRON SOURCE SUBSTRATE

BACKGROUND OF THE INVENTION

1. Field of the Invention

The present invention relates to a substrate processing apparatus for applying a uniform surface treatment on a substrate of a large area, and an apparatus for processing an electron source substrate, utilizing such substrate processing apparatus.

2. Description of the Related Art

There is already known a display panel of an image forming apparatus, utilizing a phenomenon of electron emission from a thin film, formed on a substrate by an electron source producing apparatus, by an electric current flown parallel to the film surface, and formed by combining such electron source and a phosphorescent material. Such electron emitting device generally includes two types, namely a thermal electron emitting device and a cold cathode electron emitting device. Also the cold cathode electron emitting device includes a field emission type (hereinafter referred to as FE type), a type having a metal/insulator/metal structure ((hereinafter referred to as MIM type), and a surface conduction electron emitting device.

The surface conduction electron emitting device utilizes a phenomenon of electron emission by supplying a thin film of a small area, formed on a substrate, with a current parallel to the film surface. Basic structure and producing methods thereof are disclosed, for example, in Japanese Patent Application Laid-open Nos. H07-235255 and H08-171849. A typical structure of the surface conduction electron emitting device is as follows. An electroconductive film for forming an electron emitting part, provided so as to connect a pair of device electrodes on a substrate, is subjected to an electrical energization, called a forming, and then to an activation process, thereby forming an electron emitting part.

The forming is a process of applying a voltage between the ends of the electroconductive film for forming the electron emitting part, to locally cause a destruction, a deformation or a modification in the electroconductive film, thereby forming a fissure (gap) having a state of an electrically high resistance.

The activation is a process of applying a voltage between the ends of the electroconductive film under a reduced-pressure atmosphere containing an organic compound thereby forming a carbon film in the vicinity of the fissure. The electron emission is executed from the vicinity of the fissure.

The surface conduction electron emitting device, being simple in structure and easy to manufacture, has an advantage that a multitude of elements can be arrayed over a large area, and is utilized in an electrically charge beam source and in an image forming apparatus such as a display apparatus.

In a prior producing method for a surface conduction electron emitting device, a device bearing a pair of device electrodes and an electroconductive film is placed under a reduced-pressure atmosphere and is subjected to a forming process thereby forming a fissure in the electroconductive film. Thereafter, an activation process is executed by introducing a gas of an organic compound into the reduced-pressure atmosphere and applying a suitably selected pulsed voltage for a period of from several minutes to several tends of minutes to deposit carbon or a carbon compound in the vicinity of the fissure thereby forming a carbon film. Such activation process is effective for improving the characteristics of the device. Through such activation process, the property of the electron emitting device, namely an electron emission current Ie, is improved showing a significant increase, while maintaining a threshold voltage.

However, such activation process involves following limitations.

The activation process, for depositing carbon or a carbon compound on the electron emitting part and the vicinity thereof, is executed by decomposing an organic compound which is adsorbed onto the device substrate from the atmosphere. Therefore, when a number of the devices subjected simultaneously to the activation process increases, an amount of the organic compound, that is decomposed and consumed on the electron source substrate per unit time also increases. As a result, there may be induced a fluctuation of the concentration of the organic compound in the atmosphere, a slower formation rate of the carbon film and a fluctuation in the carbon film depending on a position within the electron source substrate, thus leading to a deteriorated uniformity of the electron source.

SUMMARY OF THE INVENTION

An object of the present invention is to provide an apparatus of applying a surface processing to a substrate in the presence of a predetermined gas, such as an activation process for the electron source, capable of a uniform processing even on a substrate of a large area, and to provide an electron source processing apparatus utilizing such apparatus.

The present invention provides a substrate processing apparatus for processing a surface of a substrate to be processed, including a hermetic container equipped with an exhaust tube and a gas introducing tube and capable of setting the surface of the substrate in a hermetic atmosphere, exhaust means which exhausts the gas in the hermetic container through the exhaust tube, and gas introducing means which introduces a gas into the hermetic container through the gas introducing tube, wherein an introducing port of the gas introducing tube is positioned inside the exhaust tube.

The present invention also provides an apparatus for processing an electron source substrate which bears plural devices each provided with an electroconductive film and paired electrodes for applying a voltage to the electroconductive film on a substrate, by introducing a reducing gas under a hermetic atmosphere and applying a voltage to the paired electrodes thereby forming a gap in the electroconductive film, the apparatus including a hermetic container equipped with an exhaust tube and a gas introducing tube and capable of setting the surface of the substrate in a hermetic atmosphere, exhaust means which exhausts the gas in the hermetic container through the exhaust tube, and gas introducing means which introduces the reducing gas into the hermetic container through the gas introducing tube, wherein an introducing port of the gas introducing tube is positioned inside the exhaust tube.

The present invention also provides an apparatus for processing an electron source substrate which bears plural devices each provided with an electroconductive film having a fissure and paired electrodes for applying a voltage to the electroconductive film on a substrate, by introducing an organic compound gas in a hermetic atmosphere and applying a voltage to the paired electrodes thereby depositing carbon or a carbon compound on the electroconductive film in the vicinity of the fissure, the apparatus including a hermetic container equipped with an exhaust tube and a gas introducing tube and capable of setting the surface of the substrate in a hermetic atmosphere, exhaust means which exhausts the gas in the hermetic container through the exhaust tube, and gas introducing means which introduces the organic compound gas into the hermetic container through the gas introducing tube, wherein an introducing port of the gas introducing tube is positioned inside the exhaust tube.

Further features of the present invention will become apparent from the following description of exemplary embodiments (with reference to the attached drawings).

DETAILED DESCRIPTION OF THE INVENTION

Figure 1:
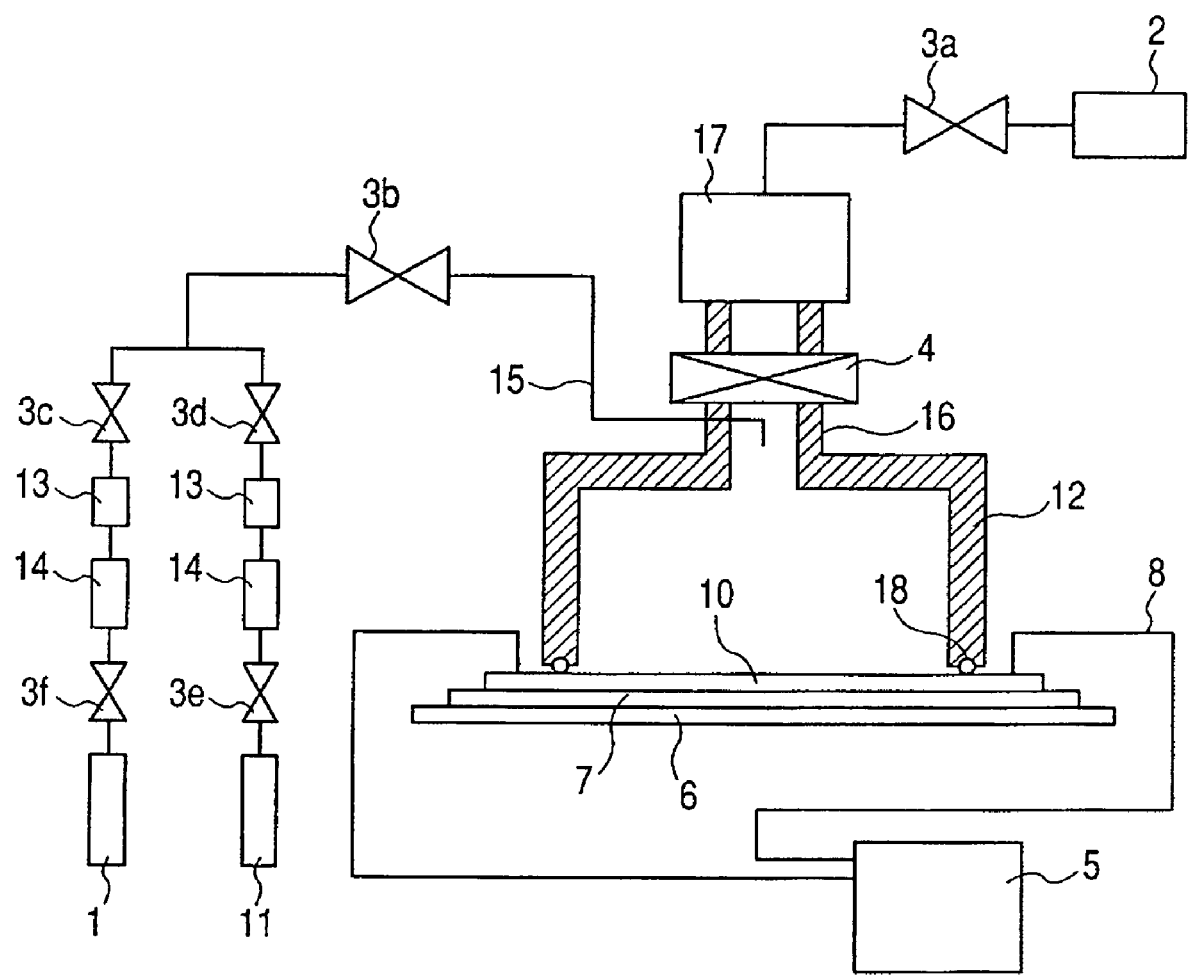
FIG. 1 is a schematic view showing an entire structure of an embodiment of the apparatus of the present invention for processing an electron source substrate.

A first aspect of the present invention is a substrate processing apparatus for processing a surface of a substrate to be processed, including a hermetic container equipped with an exhaust tube and a gas introducing tube and capable of setting the surface of the substrate in a hermetic atmosphere, exhaust means which exhausts the gas in the hermetic container through the exhaust tube, and gas introducing means which introduces a gas into the hermetic container through the gas introducing tube, wherein an introducing port of the gas introducing tube is positioned inside the exhaust tube.

A second aspect of the present invention is an apparatus for processing an electron source substrate which bears plural devices each provided with an electroconductive film and paired electrodes for applying a voltage to the electroconductive film on a substrate, by introducing a reducing gas under a hermetic atmosphere and applying a voltage to the paired electrodes thereby forming a gap in the electroconductive film, the apparatus including a hermetic container equipped with an exhaust tube and a gas introducing tube and capable of setting the surface of the substrate in a hermetic atmosphere, exhaust means which exhausts the gas in the hermetic container through the exhaust tube, and gas introducing means which introduces the reducing gas into the hermetic container through the gas introducing tube, wherein an introducing port of the gas introducing tube is positioned inside the exhaust tube.

A third aspect of the present invention is an apparatus for processing an electron source substrate which bears plural devices each provided with an electroconductive film having a fissure and paired electrodes for applying a voltage to the electroconductive film on a substrate, by introducing an organic compound gas in a hermetic atmosphere and applying a voltage to the paired electrodes thereby depositing carbon or a carbon compound on the electroconductive film in the vicinity of the fissure, the apparatus including a hermetic container equipped with an exhaust tube and a gas introducing tube and capable of setting the surface of the substrate in a hermetic atmosphere, exhaust means which exhausts the gas in the hermetic container through the exhaust tube, and gas introducing means which introduces the organic compound gas into the hermetic container through the gas introducing tube, wherein an introducing port of the gas introducing tube is positioned inside the exhaust tube.

The apparatus of the present invention, enabling a uniform surface processing on a substrate of a large area, is advantageously applicable to various film forming processes on a substrate of a large area. Particularly in an activation process of an electron source, it is capable of depositing carbon or a carbon compound uniformly on plural devices on a substrate, thereby producing an electron source of uniform electron emitting characteristics.

The substrate processing apparatus of the present invention is advantageously applicable to various film forming processes, but will be explained, as an example, in a particularly advantageous application to a forming process and an activation process of the electron source substrate.

Figure 2:
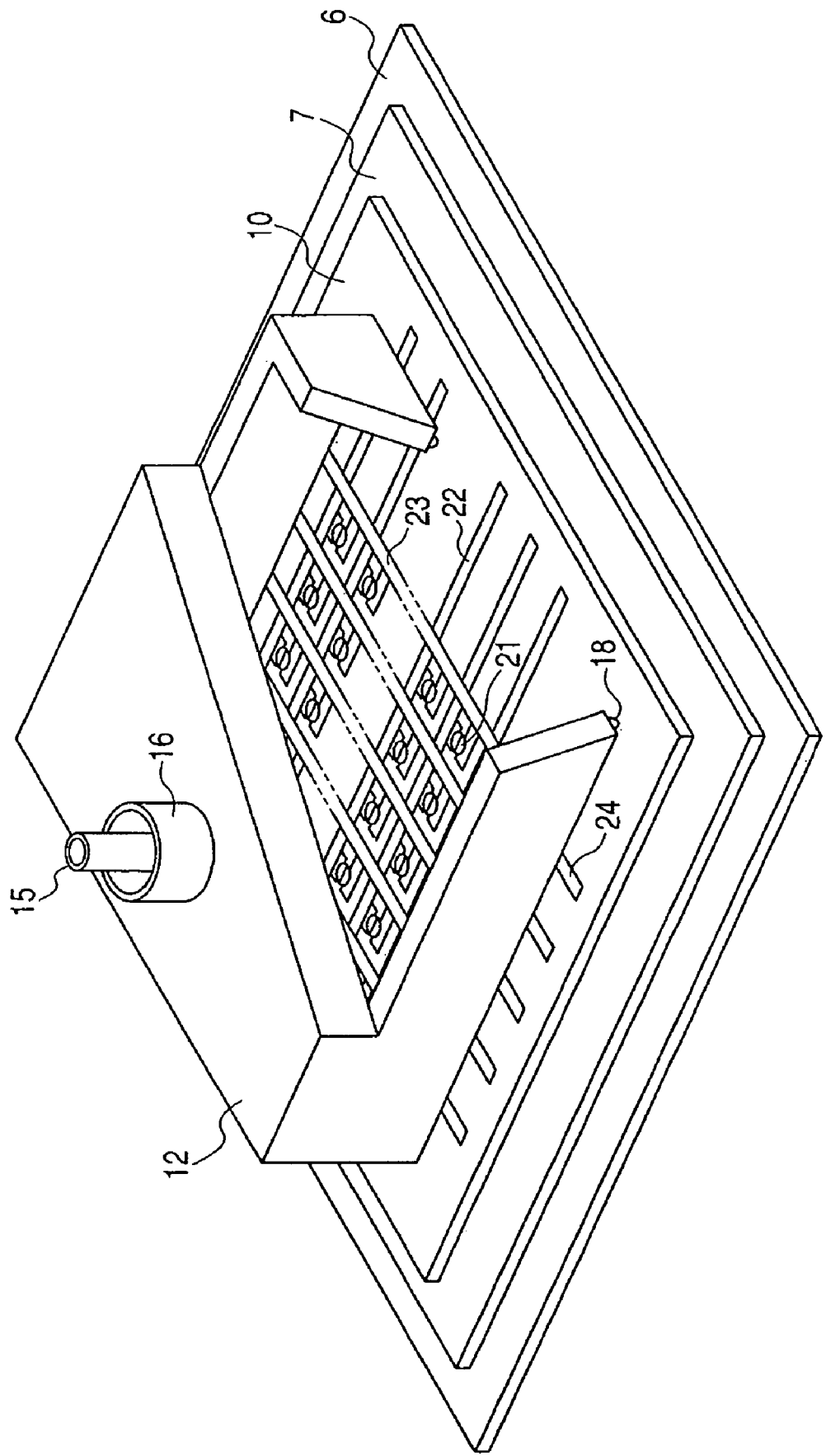
FIG. 2 is a schematic partially cut-off perspective view of the apparatus for processing an electron source substrate shown in FIG. 1.
Figure 3:
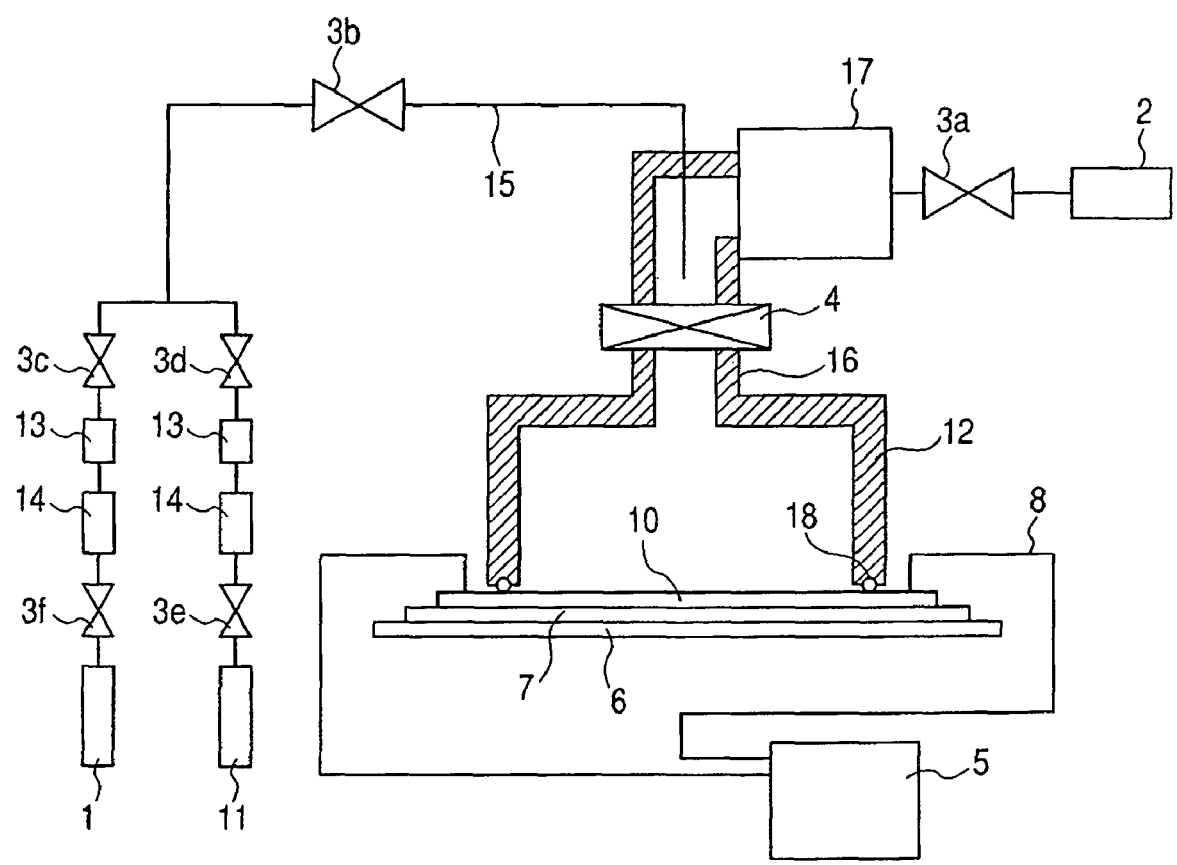
FIG. 3 is a schematic view showing an entire structure of another embodiment of the apparatus of the present invention for processing an electron source substrate.

FIGS. 1, 2 and 3 illustrate an embodiment of the apparatus for processing an electron source substrate of the present invention, wherein FIG. 2 is a perspective view of a producing apparatus, showing a peripheral portion of the electron source substrate, and FIGS. 1 and 3 are respectively a schematic cross-sectional view of the apparatus and a schematic view showing a piping structure. Referring to FIGS. 1 to 3, there are shown a carrier gas 1, an auxiliary pump 2, valves 3*a*-3*f*, a gate valve 4, a driver 5 constituted of a power source and a current control system, a support member 6, a thermal conduction member 7, a connecting wiring 8, an electron source substrate 10, and an organic compound gas 11. There are also shown a hermetic container 12, a gas flow rate controller 13, a moisture removing filter 14, a gas introducing tube 15, an exhaust tube 16, a main vacuum pump 17, a sealing member 18, an electroconductive film 21 of the device, X-direction wirings 22, Y-direction wirings 23 and lead wirings 24.

In the apparatus shown in FIGS. 1 to 3, the support member 6, for supporting and fixing the electron source substrate 10, is equipped with a mechanism for mechanically fixing the electron source substrate 10 by a vacuum chucking mechanism, an electrostatic chucking mechanism or a fixing jig. The support member 6 incorporates therein an unillustrated heater, and is capable of heating the electron source substrate 10 through the thermal conduction member 7, when necessary.

The hermetic container 12 is formed by glass or stainless steel, and is preferably formed by a material showing little gas release from the container. The hermetic container 12 has such a structure as to cover an entire area of the conductive film 21 on the electron source substrate 10, except for the lead wirings 24, and to withstand a pressure of a range of from $1.33 \times 10^{-6}$ Pa ($1 \times 10^{-8}$ Torr) to the atmospheric pressure.

The sealing member 18 is to maintain the electron source substrate 10 and the hermetic container 12 in a hermetic state, and is constituted for example of an O-ring or a rubber sheet.

The organic compound gas 11, to be employed in the activation of the electron source substrate 10, is a mixed gas, diluted for example with nitrogen, helium or argon. Also in case of executing a forming process to be explained later, a gas promoting the gap formation in the electroconductive film 21, for example a reducing hydrogen gas, may be introduced into the hermetic container 12.

Examples of the organic compound to be employed in the activation process of the electron source substrate 10 include aliphatic hydrocarbons such as an alkane, an alkene or an alkine, aromatic hydrocarbons, alcohols, aldehydes, ketones, amines, nitrites, phenol, carvone, organic acids such as a sulfonic acid. More specifically, there can be employed a saturated hydrocarbon represented by $C_nH_{2n+2}$ such as methane, ethane or propane, an unsaturated hydrocarbon represented by $C_nH_{2n}$ such as ethylene or propylene, benzene, toluene, methanol, ethanol, acetaldehyde, acetone, methyl ethyl ketone, methylamine, ethylamine, phenol, benzonitrile or acetonitrile.

An organic compound that is gaseous at the normal temperature may be directly utilized as the organic compound gas 11. On the other hand, an organic compound that is liquid or solid at the normal temperature may be used by evaporation or sublimation in a container or further by mixing with a diluting gas. For the carrier gas 1, an inert gas such as nitrogen, argon or helium is used.

The organic compound gas 11 and the carrier gas 1 are mixed at a predetermined proportion and introduced into the hermetic container 12. Flow rates and a mixing ratio thereof are controlled by individual gas glow rate controllers 13. Each gas flow rate controller 13 is constituted of a mass flow controller and an electromagnetic valve. Such mixed gas is heated, if necessary, to an appropriate temperature by an unillustrated heater provided around the gas introducing tube 15 and introduced into the hermetic container 12 through an introducing port provided therein. A heated temperature of the mixed gas is preferably comparable to the temperature of the electron source substrate 10.

In a path between the gas flow rate controller 13 and the gas introducing tube 15, the moisture removing filter 14 is preferably provided for removing moisture from the introduced gas. The moisture removing filter 14 may employ a moisture absorbing material such as silica gel, molecular sieve or magnesium hydroxide.

The mixed gas, introduced into the hermetic container 12, is discharged at a constant exhaust rate by the vacuum pump 17, through the exhaust tube 16 connected to the hermetic container 12, whereby the mixed in the hermetic container 12 is maintained at a constant pressure. The vacuum pump 17 to be employed i the present invention is a high vacuum pump such as a cryopump of reservoir type or a turbo molecular pump, and is preferably an oil-free pump.

In the present embodiment, a pressure of the mixed gas, though variable depending on the type of the organic compound to be employed in the activation process, is preferably such that an average free path $\lambda$ of the gas molecules constituting the mixed gas is sufficiently larger than an internal size of the hermetic container 12.

Also a partial pressure of water in the atmosphere of the hermetic container 12 is preferably $1.3 \times 10^{-4}$ Pa ($1.0 \times 10^{-6}$ Torr) or less.

The introduction of the organic compound gas into the hermetic container 12 is executed through the gas introducing tube 15, of which an introducing port is positioned, according to the present invention, inside the exhaust tube 16. The introducing port of the gas introducing tube 15 positioned inside the exhaust tube 16 allows to control the flow of the mixed gas, thereby feeding the organic compound gas uniformly over the entire surface of the substrate 10. Preferably, the introducing port of the gas introducing tube 15 is in a position retracted from an exhaust port (mounting part on the hermetic container 12) of the exhaust tube 16.

In the embodiment shown in FIG. 1, the introducing port of the gas introducing tube 15 is fixed in a position between the gate valve 14 and the exhaust port. On the other hand, in the embodiment shown in FIG. 3, the introducing port of the gas introducing tube 15 is rendered vertically movable by an unillustrated drive mechanism. By such drive mechanism, the introducing port, when required in the process, is lowered toward the substrate 10 to a position lower than the gate valve 14, and, when not required in the process, the introducing port is elevated higher than the gate valve 4 and stored at the side of the vacuum pump 17.

The embodiments shown in FIGS. 1 and 3 also take an improvement in the production efficiency into consideration. As the hermetic container 12 has to reach a pressure for the activation process from the atmospheric pressure within a short time, a vacuum pump 17 having a large effective exhaust rate particularly for water molecules is adopted. Such large (high) effective exhaust rate of the vacuum pump 17 will cause a local decrease of the pressure on the substrate 10 directly below the exhaust tube 16, thereby detrimentally affecting the uniformity of the organic compound gas. In the present embodiment, however, the introducing port of the introducing tube 15 positioned inside the exhaust tube 16 realizes a positive supply of the organic compound gas into a local space of reduced pressure present directly under the exhaust tube 16. As a result, the organic compound gas has little pressure distribution over the entire surface of the substrate 10, thereby providing an excellent productivity.

The apparatus of the invention for processing the electron source substrate as shown in FIGS. 1 to 3 is advantageously applicable, not only to the activation process of the electron source substrate but also to a forming process, that is to be executed prior to the activation process. Therefore the present invention allows to execute the forming process and the activation process in continuation. Particularly in case of executing the forming process by introducing a reducing gas, such gas can be uniformly introduced into the hermetic container 12.

In the embodiments shown in FIGS. 1 to 3, the hermetic container 12 is placed, across the sealing member 18, on the surface of the electron source substrate 10, thereby forming a container including the electron source substrate 10 as a bottom and maintaining the interior in a hermetically sealed state. However, the substrate processing apparatus of the invention is not restricted to such constitution, and there is also advantageously employed a constitution of utilizing a hermetic container including a bottom part, and executing the process by placing a substrate in such container.

EXAMPLES

Example 1

Figure 4:
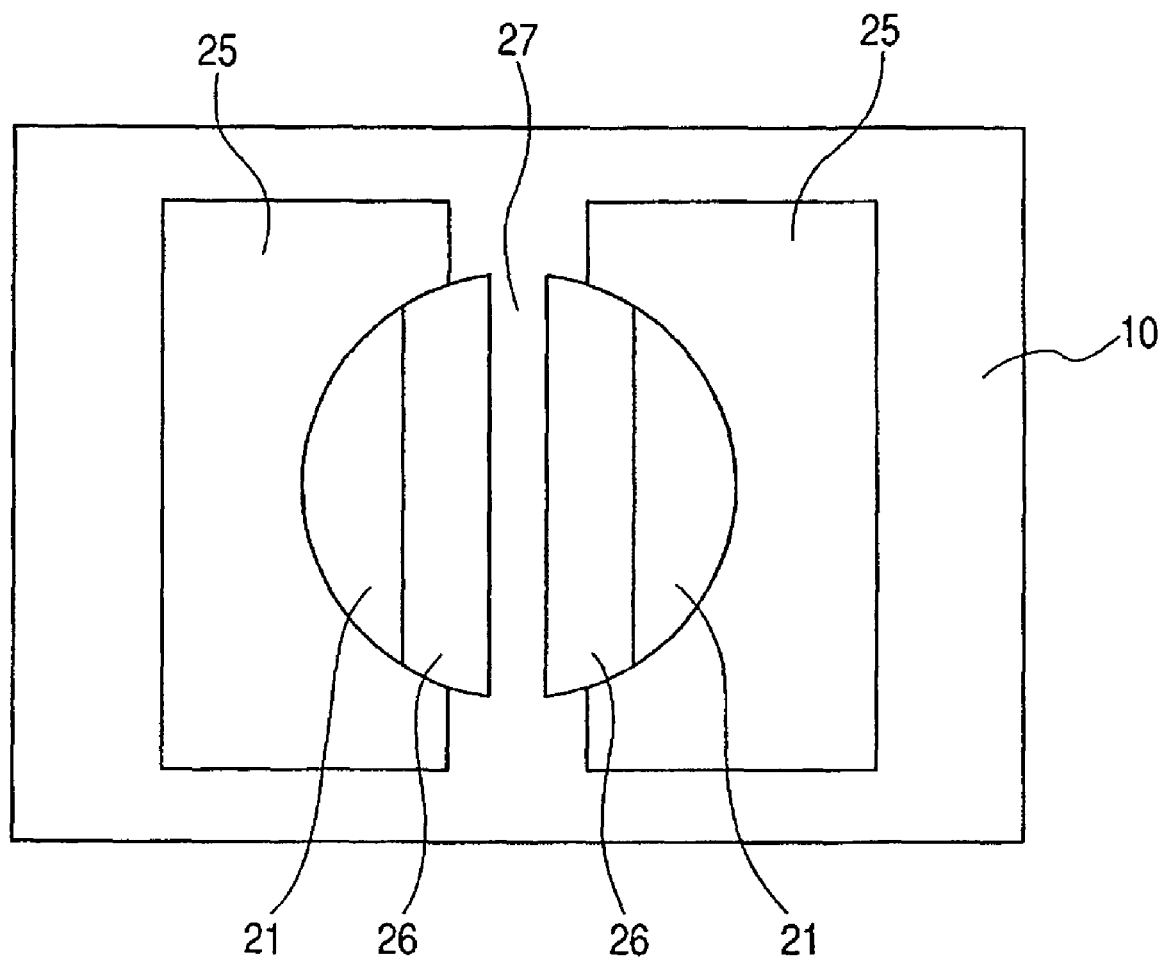
FIG. 4 is a schematic plan view showing structure of an electron emitting device prepared with the processing apparatus of the present invention.
Figure 5:
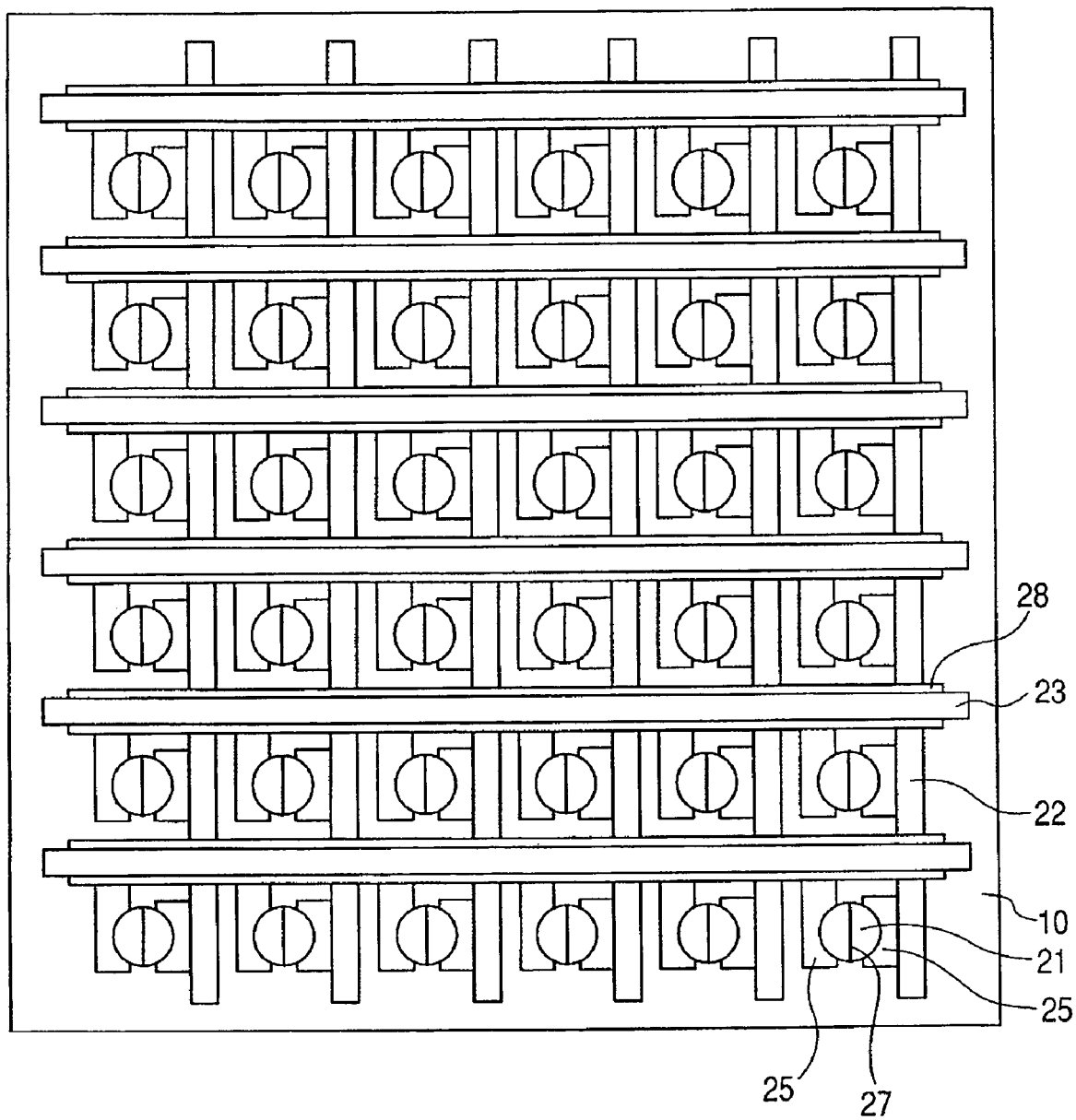
FIG. 5 is a schematic plan view showing structure of an electron source substrate prepared with the processing apparatus of the present invention.

The present example is to produce an electron source substrate as shown in FIG. 5, having a plurality of a surface conduction electron emitting device as shown in FIG. 4. In FIGS. 4 and 5, there are shown an electron source substrate 10, an electroconductive film 21, X-direction wirings 22, Y-direction wirings 23, device electrodes 25, a carbon film 26, a gap 27 in the carbon film 26, and an insulation layer 28. The carbon film 26 is omitted in FIG. 5, for the purpose of simplicity.

At first, on a glass substrate bearing a $SiO_2$ layer, a Pt paste was printed and calcined under heating to form the device electrodes 25. Then an Ag paste was screen printed and calcined under heating to form the X-direction wirings 22 (240 wirings) and the Y-direction wirings 23 (720 wirings). In a crossing part of the X-direction wiring 22 and the Y-direction wiring 23, an insulating paste was screen printed and calcined under heating to form the insulation layer 28.

Then, between each pair of the device electrodes 25, 25, a palladium complex solution was dropped by an emission apparatus of bubble jet (trade name) type and heated to form an electronconductive film 21 of palladium oxide, as shown in FIG. 5. In this manner, an electron source substrate 10 was prepared, in which devices each including a pair of the device electrodes 25, 25 and the electroconductive film 21 were matrix wired by the X-direction wirings 22 and the Y-direction wirings 23.

The electron source substrate 10, thus prepared, was fixed on the support member 6 of the processing apparatus shown in FIGS. 1 and 2.

Then the hermetic container 12 made of stainless steel was placed, across the sealing member 18, on the electron source substrate 10 in such a manner that the lead wirings 24 protrude from the hermetic container 12.

The gate valve 4 of the exhaust tube 16 connected to the exhaust port of the hermetic container 12 was opened, and the interior of the hermetic container 12 was evacuated by the vacuum pump 17. At the forming process and the activation process to be explained later, the substrate 10 is heated by a heater incorporated in the support member 6. The present embodiment employed a cryopump of reservoir type as the vacuum pump 17. The cryopump has a very large exhaust rate for water, equal to or larger than 3 times of that of a turbo molecular pump of a same aperture, and is capable, even in a batch type apparatus, of reaching a high vacuum region within a short time from the atmospheric pressure. As described before, the pressure of the organic compound gas usually becomes locally lower directly under the exhaust tube 16. In the present invention, however, such local pressure loss of the organic compound gas can be suppressed, since the introducing port of the gas introducing tube 15 is positioned inside the exhaust tube 16 and since the exhaust tube 16 and the gas introducing tube 15 are provided concentrically.

Then, the driver 5, connected to the lead wirings 30 through the connection wiring 31 shown in FIG. 1, applied a voltage between the device electrodes 25, 25 of each device on the electron source substrate 10. In this manner, the electroconductive film 21 was subjected to a forming process and a gap 27 as shown in FIG. 4 was formed therein.

In succession, the same apparatus was used to conduct an activation process. A mixed gas of the organic compound gas 11 and the carrier gas 1 was introduced into the hermetic container 12 by opening the gas supply valves 3c, 3d and 3b. Nitrogen gas mixed with ethylene was employed as the organic compound gas 11, and nitrogen gas was employed as the carrier gas 1. The opening of the valve 3b was regulated, under monitoring of an unillustrated vacuum gauge provided in the hermetic container 12, in such a manner that the hermetic container 12 had an internal pressure of $1.3 \times 10^{-4}$ Pa.

After the introduction of the organic compound gas, an activation process was conducted by applying a voltage between the device electrodes 25, 25 of each device from the driver 5, through the X-direction wiring 22 and the Y-direction wiring 23. The activation was conducted by commonly connecting all the Y-direction wirings 23 and non-selected ones of the X-direction wirings 22 to a ground potential GND, while selecting 10 wirings out of the X-direction wirings 22 and applying a pulsed voltage in succession to thus selected lines. The activation was conducted on all the lines in the X-direction by repeating the above-described operation. After the activation process, a device current If was measured for each X-direction wiring and compared. As a result, the device current If showed little fluctuation among the wirings, indicating a satisfactory activation process. Stated differently, the organic compound gas was distributed uniformly over the entire surface of the substrate 10, thus reducing the fluctuation in the device current If and realizing a satisfactory activation. The device current If means a current flowing between the device electrodes of the electron emitting device.

In the electron emitting device after the activation process, carbon films 26, 26 were formed across the gap 27, as shown in FIG. 4.

Also at the activation process, a gas analysis was conducted in the exhaust tube 16, utilizing an unillustrated mass spectroscopy apparatus equipped with a differential exhaust apparatus. As a result, simultaneous with the introduction of the mixed gas, m/z=28 of nitrogen and ethylene and m/z=26 of ethylene fragment increased and saturated instantaneously, and both values remained constant during the activation process.

Example 2

An electron source substrate 10 shown in FIG. 5 was prepared in a similar manner as in Example 1, utilizing the processing apparatus shown in FIG. 3. In this example, the introducing port of the gas introducing tube 15 is rendered vertically movable, by an unillustrated drive mechanism, inside the exhaust tube 16. At the activation process, the introducing port of the gas introducing tube 15 was lowered, by the drive mechanism, to a position, in the exhaust tube 16, lower than the gate valve 4 and closer to the substrate 10. A mixed gas of the organic compound gas 11 and the carrier gas 1 was introduced into the hermetic container 12 by opening the gas supply valves 3c, 3d and 3b. Nitrogen gas mixed with ethylene was employed as the organic compound gas 11, and nitrogen gas was employed as the carrier gas 1. The opening of the valve 3b was regulated, under monitoring of an unillustrated vacuum gauge provided in the hermetic container 12, in such a manner that the hermetic container 12 had an internal pressure of $1.3 \times 10^{-4}$ Pa.

At the completion of the activation process, the introducing port of the gas introducing tube 15 was retracted, by the drive mechanism, to a position above the gate valve 4. FIG. 3 shows a state in which the the introducing port of the gas introducing tube 15 is retracted.

In the electron emitting device of the present example after the activation process, carbon films 26, 26 were formed across the gap 27 as in Example 1, as shown in FIG. 4. A measurement of device current If after the activation process as in Example 1 indicated that a satisfactory activation process could be achieved.

Example 3

Figure 6:
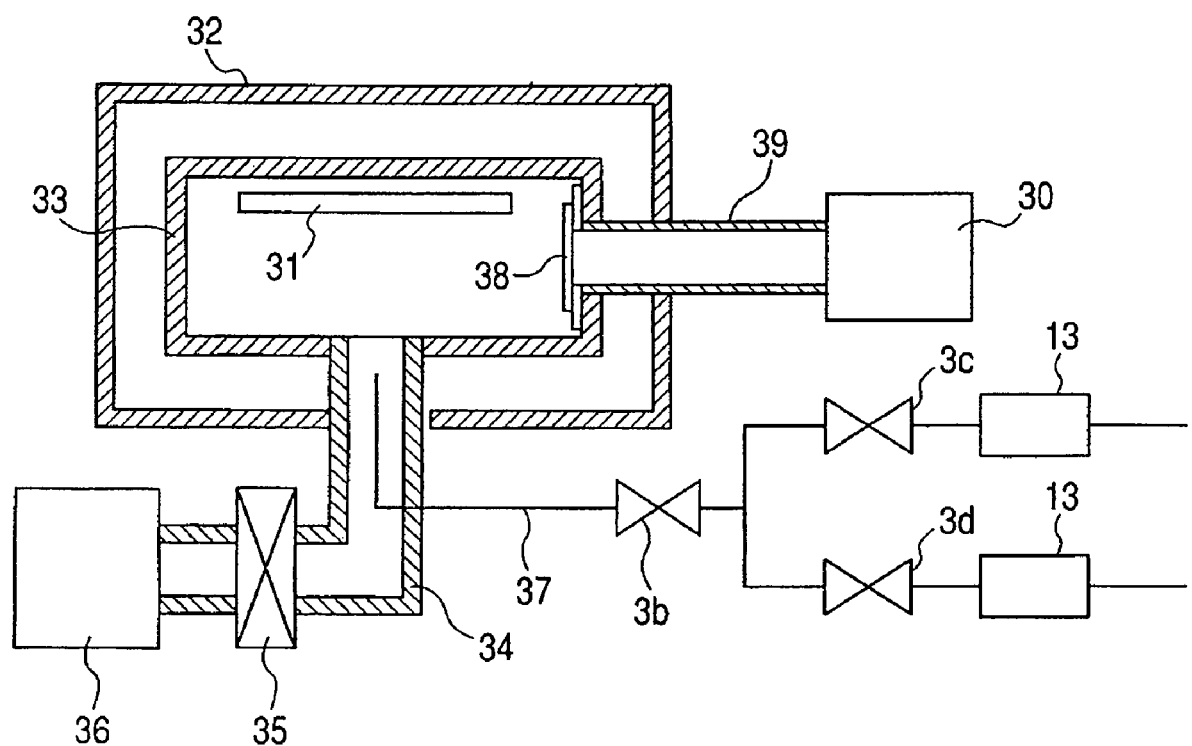
FIG. 6 is a schematic view showing an entire structure of a plasma film forming apparatus embodying the present invention.

The present examples shows an application of the substrate processing apparatus of the invention to a plasma processing apparatus. FIG. 6 shows a constitution of the apparatus of the present example, in which shown are a high frequency oscillator 30, a substrate 31, a hermetic container 32, a plasma processing chamber 33, an exhaust tube 34, a gate valve 35, a vacuum pump 36, a gas introducing tube 37, a high frequency introducing window 38 and a waveguide 39.

In the present example, the plasma processing chamber 33 is provided in the hermetic container 32. The substrate 31 to be processed is in the processing chamber 33, which is connected to the exhaust tube 34 and is evacuated by the vacuum pump 36. The gas introducing tube 37 is provided inside the exhaust tube 34 and feed a process gas into the plasma processing chamber 33. The high frequency oscillator 30 emits irradiates the plasma processing chamber 33 with a high frequency wave through the waveguide 39 and the high frequency introducing window 38. The high frequency introducing window 38 and the waveguide 39 are hermetically sealed with unillustrated O-rings, which are formed of Kalrez rubber of high heat resistance. Also in consideration of the safety of the apparatus, a cooling mechanism, though not illustrated, is provided around the O-rings.

The process gas is supplied to the plasma processing chamber 33 from the gas introducing tube 37, by means of gas valves 3c, 3b and 3d, and a gas flow rate controller 13.

With such plasma processing apparatus, an experiment was conducted to form a Si-based semiconductor film on a substrate by a plasma CVD method, under following conditions:

high frequency wave: microwave of 2.45 GHz, and charged power of 800 W;
pressure: 133 Pa;
process gas: $SiF_4/H_2$=200/800 sccm;
film forming time: 1 hour;
substrate size: square with a side of 300 mm.

Plasma was generated in stable manner during the experiment, and the high frequency introducing window 38 was not cracked by the heat of the plasma and maintained the sealing property until the film forming experiment was completed. A Si-based semiconductor film deposited on the substrate 31 showed a uniform thickness over the entire substrate. It was therefore proven that the process gas could be introduced uniformly over the substrate of a large area.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Laid-Open No. 2005-235149, filed Aug. 15, 2005 which is hereby incorporated by reference herein in its entirety.

What is claimed is:

1. A substrate processing apparatus for processing a surface of an electron source substrate to be processed, comprising:
   a hermetic container containing a volume therein, and equipped with an exhaust tube in communication with the volume, the exhaust tube having a gas flowing path inside of the gas exhaust tube and a gas introducing tube having a gas flowing path inside of the gas introducing tube, and capable of setting the surface of the substrate in a hermetic atmosphere;
   exhaust means which exhausts the gas in the hermetic container through the exhaust tube; and
   gas introducing means which introduces a gas into the hermetic container through the gas introducing tube,
   wherein an end portion of the gas introducing tube, from which the gas exits the gas introducing tube to be introduced into the hermetic container, is positioned inside the gas exhaust tube, in the gas flowing path of the gas exhaust tube, without extending into the volume, such that the gas exiting the gas introducing tube and the gas exhausting the hermetic container through the exhaust tube, are inter-mingled inside of the gas exhaust tube.

2. An apparatus for processing an electron source substrate which bears plural devices each provided with an electroconductive film and paired electrodes for applying a voltage to the electroconductive film on a substrate, by introducing a reducing gas under a hermetic atmosphere and applying a voltage to the paired electrodes thereby forming a gap in the electroconductive film, the apparatus comprising:
   a hermetic container containing a volume herein, and equipped with a gas exhaust tube in communication with the volume, the exhaust tube having a gas flowing path inside of the gas exhaust tube and a gas introducing tube having a gas flowing path inside of the gas introducing tube, and capable of setting the surface of the substrate in a hermetic atmosphere;
   exhaust means which exhausts the gas in the hermetic container through the exhaust tube; and
   gas introducing means which introduces the reducing gas into the hermetic container through the gas introducing tube,
   wherein an end portion of the gas introducing tube, from which the gas exits the gas introducing tube to be introduced into the hermetic container, is positioned inside the gas exhaust tube, in the gas flowing path of the gas exhaust tube, without extending into the volume, such that the gas exiting the gas introducing tube and the gas exhausting the hermetic container through the exhaust tube, are inter-mingled inside of the gas exhaust tube.

3. An apparatus for processing an electron source substrate which bears plural devices each provided with an electroconductive film having a fissure and paired electrodes for applying a voltage to the electroconductive film on a substrate, by introducing an organic compound gas in a hermetic atmosphere and applying a voltage to the paired electrodes thereby depositing carbon or a carbon compound on the electroconductive film in the vicinity of the fissure, the apparatus comprising:
   a hermetic container containing a volume there, and equipped with an exhaust tube in communication with the volume, the exhaust tube having a gas flowing path inside of the gas exhaust tube and a gas introducing tube having a gas flowing path inside of the gas introducing tube, and capable of setting the surface of the substrate in a hermetic atmosphere;
   exhaust means which exhausts the gas in the hermetic container through the exhaust tube; and
   gas introducing means which introduces the organic compound gas into the hermetic container through the gas introducing tube,
   wherein an end portion of the gas introducing tube, from which the gas exits the gas introducing tube to be introduced into the hermetic container, is positioned inside the gas exhaust tube, in the gas flowing path of the gas exhaust tube, without extending into the volume, such that the gas exiting the gas introducing tube and the gas exhausting the hermetic container through the exhaust tube, are inter-mingled inside of the gas exhaust tube.

* * * * *